United States Patent
Chan et al.

(10) Patent No.: US 9,893,131 B2
(45) Date of Patent: Feb. 13, 2018

(54) TEST ELEMENT GROUP, METHOD OF TESTING ELECTRICAL CHARACTERISTICS OF SEMICONDUCTOR ELEMENTS, AND FABRICATING METHOD THEREOF

(71) Applicant: BOE TECHNOLOGY GROUP CO., LTD., Beijing (CN)

(72) Inventors: Yucheng Chan, Beijing (CN); Shuai Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/513,290

(22) PCT Filed: Oct. 13, 2016

(86) PCT No.: PCT/CN2016/101957
§ 371 (c)(1),
(2) Date: Mar. 22, 2017

(87) PCT Pub. No.: WO2017/088599
PCT Pub. Date: Jun. 1, 2017

(65) Prior Publication Data
US 2017/0301741 A1    Oct. 19, 2017

(30) Foreign Application Priority Data
Nov. 24, 2015  (CN) .......................... 2015 1 0824468

(51) Int. Cl.
*H01L 27/32*    (2006.01)
*H01L 25/03*    (2006.01)
(Continued)

(52) U.S. Cl.
CPC ........ *H01L 27/3248* (2013.01); *G02F 1/1362* (2013.01); *H01L 22/30* (2013.01); *H01L 25/03* (2013.01); *H01L 27/2481* (2013.01)

(58) Field of Classification Search
None
See application file for complete search history.

(56) References Cited

U.S. PATENT DOCUMENTS 5,999,012 A * 12/1999 Listwan ................. G01N 21/95
                                                324/754.23
2008/0123005 A1* 5/2008 Sohn ...................... G02F 1/1309
                                                349/40

(Continued)

FOREIGN PATENT DOCUMENTS

CN        1745477 A        3/2006
CN     101236338 A        8/2008

(Continued)

OTHER PUBLICATIONS

International Search Report & Written Opinion dated Dec. 30, 2016 regarding PCT/CN2016/101957.

(Continued)

*Primary Examiner* — Jermele M Hollington
*Assistant Examiner* — Suresh K Rajaputra
(74) *Attorney, Agent, or Firm* — Intellectual Valley Law, P.C.

(57) ABSTRACT

The present application discloses an array substrate having a plurality of semiconductor elements and a plurality of test electrodes. Each of the plurality of semiconductor elements comprises a plurality of terminals, each of which is electrically connected to a different test electrode. At least one of the plurality of test electrodes is electrically connected to at least two different semiconductor elements.

20 Claims, 5 Drawing Sheets

(51) Int. Cl.
    *H01L 21/66*      (2006.01)
    *H01L 27/24*      (2006.01)
    *G02F 1/1362*     (2006.01)

(56)                    References Cited

U.S. PATENT DOCUMENTS

2009/0207369 A1*  8/2009  Lin .................... G02F 1/13452
                                                          349/152
2016/0146880 A1*  5/2016  Cai ........................ H01L 22/34
                                                          324/750.3
2017/0194219 A1*  7/2017  Ji ............................ H01L 22/14

FOREIGN PATENT DOCUMENTS

| CN | 103185845 A | 7/2013 |
| CN | 104362156 A | 2/2015 |
| CN | 105206601 A | 12/2015 |
| CN | 105259722 A | 1/2016 |
| CN | 205092238 U | 3/2016 |
| CN | 205121122 U | 3/2016 |
| CN | 105632959 A | 6/2016 |
| CN | 105655350 A | 6/2016 |
| JP | H08279538 A | 10/1996 |
| JP | 2007040926 A | 2/2007 |
| WO | 2004059734 A1 | 7/2004 |

OTHER PUBLICATIONS

First Office Action in the Chinese Patent Application No. 201510824468.7, dated Oct. 19, 2017; English translation attached.

\* cited by examiner

TEST ELEMENT GROUP, METHOD OF TESTING ELECTRICAL CHARACTERISTICS OF SEMICONDUCTOR ELEMENTS, AND FABRICATING METHOD THEREOF

CROSS-REFERENCE TO RELATED APPLICATION

This application is a national stage application under 35 U.S.C. § 371 of International Application No. PCT/CN2016/101957, filed Oct. 13, 2015, which claims priority to Chinese Patent Application No. 201510824468.7, filed Nov. 24, 2015, the contents of which are incorporated by reference in the entirety.

TECHNICAL FIELD

The present invention relates to display technology, more particularly, to a test element group, an array substrate and a display panel having the same, a method of testing electrical characteristics of a plurality of semiconductor elements, and a fabricating method thereof.

BACKGROUND

Typically, a display panel includes a display area and a peripheral area. The display panel includes a plurality of semiconductor elements in the display area. In the manufacturing process of a display panel, the electrical properties of the plurality of semiconductor elements need to be tested to ensure they function properly. To assess electrical properties of the semiconductor elements in the display panel, a pattern of measuring elements, test element group, is formed in the peripheral area of the display panel. The test element group is electrically tested for determining whether semiconductor elements are suitably formed in the display panel.

SUMMARY

In one aspect, the present disclosure provides an array substrate comprising a plurality of semiconductor elements; and a plurality of test electrodes; wherein each of the plurality of semiconductor elements comprises a plurality of terminals, each of which is electrically connected to a different test electrode; and at least one of the plurality of test electrodes is electrically connected to at least two different semiconductor elements.

Optionally, the plurality of semiconductor elements comprise a first thin film transistor and a second thin film transistor; each of a source electrode, a drain electrode, and a gate electrode of the first thin film transistor is electrically connected to a different test electrode; each of a source electrode, a drain electrode, and a gate electrode of the second thin film transistor is electrically connected to a different test electrode; the first thin film transistor and the second thin film transistor are commonly electrically connected to at least one test electrode; a channel region of the first thin film transistor is along a first direction from the source electrode to the drain electrode of the first thin film transistor; a channel region of the second thin film transistor is along a second direction from the source electrode to the drain electrode of the second thin film transistor; and the first direction is substantially perpendicular to the second direction.

Optionally, the gate electrode of the first thin film transistor and the gate electrode of the second thin film transistor are commonly electrically connected to a first test electrode.

Optionally, the gate electrode of the first thin film transistor, the gate electrode of the second thin film transistor, and the first test electrode are in a same layer and are made of a same electrode material.

Optionally, one of the source electrode and the drain electrode of the first thin film transistor and one of the source electrode and the drain electrode of the second thin film transistor are commonly electrically connected to a second test electrode.

Optionally, the source electrode and the drain electrode of the first thin film transistor, the source electrode and the drain electrode of the second thin film transistor, and the second test electrode are in a same layer and are made of a same electrode material.

Optionally, the gate electrode of the first thin film transistor and the gate electrode of the second thin film transistor are commonly electrically connected to a first test electrode; and one of the source electrode and the drain electrode of the first thin film transistor and one of the source electrode and the drain electrode of the second thin film transistor are commonly electrically connected to a second test electrode.

Optionally, the plurality of semiconductor elements comprise at least a first electrostatic discharge diode circuit and a second electrostatic discharge diode circuit; the first electrostatic discharge diode circuit is electrically connected to two different test electrodes; the second electrostatic discharge diode circuit is electrically connected to two different test electrodes; and the first electrostatic discharge diode circuit and the second electrostatic discharge diode circuit are commonly electrically connected to a third test electrode.

Optionally, the plurality of semiconductor elements comprise at least a first thin film transistor and at least a first electrostatic discharge diode circuit; each of a source electrode, a drain electrode, and a gate electrode of the first thin film transistor are electrically connected to a different test electrode; the first electrostatic discharge diode circuit is electrically connected to two different test electrodes; and the first thin film transistor and the first electrostatic discharge diode circuit are commonly electrically connected to a fourth test electrode.

Optionally, the source electrode and the drain electrode of the first thin film transistor, and the fourth test electrode are in a same layer and are made of a same electrode material.

Optionally, the array substrate comprises M thin film transistors; a first test electrode, a second test electrode, and a third test electrode; M is a positive integer larger than 1; wherein all gate electrodes of M thin film transistors are commonly electrically connected to a first test electrode; all source electrodes of M thin film transistors are electrically connected to one of the second test electrode and the third test electrode, but not both; and all drain electrodes of M thin film transistors are electrically connected to one of the second test electrode and the third test electrode, but not both.

Optionally, the array substrate comprises P electrostatic discharge diode circuits; and (P+1) test electrodes comprising a first group of test electrode and a second group of test electrodes; P is a positive integer larger than 1; wherein the first group of test electrodes comprises (P−1) test electrodes, and the second group of test electrode comprises two test electrodes; each of the first group of test electrodes is electrically connected to two electrostatic discharge diode circuits; each of the second group of test electrodes is electrically connected to only one electrostatic discharge diode circuit; and the two test electrodes in the second group are electrically connected to two different electrostatic discharge diode circuits.

Optionally, the array substrate further comprises M thin film transistors; M is a positive integer larger than 1; wherein the (P+1) test electrodes comprises a first test electrode, a second test electrode, and a third test electrode; all gate electrodes of M thin film transistors are commonly electrically connected to a first test electrode; all source electrodes of NI thin film transistors are electrically connected to one of the second test electrode and the third test electrode, but not both; and all drain electrodes of M thin film transistors are electrically connected to one of the second test electrode and the third test electrode, but not both.

Optionally, M is 2, and P is 3.

Optionally, the array substrate comprises N semiconductor elements, and (N−1) test electrodes sufficient for testing electrical properties of all of N semiconductor elements; N is a positive integer larger than 1.

Optionally, the array substrate has a display area and a peripheral area, wherein the plurality of test electrodes are in the peripheral area.

In another aspect, the present disclosure provides a display panel comprising an array substrate described herein.

In another aspect, the present disclosure provides a display apparatus comprising a display panel described herein.

In another aspect, the present disclosure provides a test element group for testing electrical characteristics of a plurality of semiconductor elements in a semiconductor device, comprising a plurality of test electrodes, at least one of which is electrically connected to at least two different semiconductor elements; wherein each of the plurality of semiconductor elements comprises a plurality of terminals, each of which is electrically connected to a different test electrode.

In another aspect, the present disclosure provides a method of fabricating an array substrate, comprising forming a plurality of semiconductor elements, each of which comprising a plurality of terminals; and forming a plurality of test electrodes; wherein each of the plurality of terminals of each semiconductor element is formed to be electrically connected to a different test electrode; and at least one of the plurality of test electrodes is formed to be electrically connected to at least two of the plurality of semiconductor elements.

In another aspect, the present disclosure provides a method of testing electrical properties of a plurality of semiconductor elements in a semiconductor device having a plurality of test electrodes; a first semiconductor element and a second semiconductor element are commonly electrically connected to at least one of the plurality of test electrode; the method comprising sequentially testing electrical properties of the first semiconductor element and the second semiconductor element using a testing apparatus having a plurality probes; wherein the step of testing electrical properties of the first semiconductor element comprises placing two or more probes on two or more test electrodes electrically connected to the first semiconductor element; and applying a voltage signal to one of the two or more test electrodes electrically connected to the first semiconductor element; the step of testing electrical properties of the second semiconductor element comprises placing two or more probes on two or more test electrodes electrically connected to the second semiconductor element; and applying a voltage signal to one of the two or more test electrodes electrically connected to the second semiconductor element; the step of testing electrical properties of the second semiconductor element is performed subsequent to the step of testing electrical properties of the first semiconductor element; and prior to the step of testing electrical properties of the second semiconductor element; a probe placed the at least one of the plurality of test electrode electrically connected to both the first semiconductor element and the second semiconductor element remains on the at least one of the plurality of test electrode.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
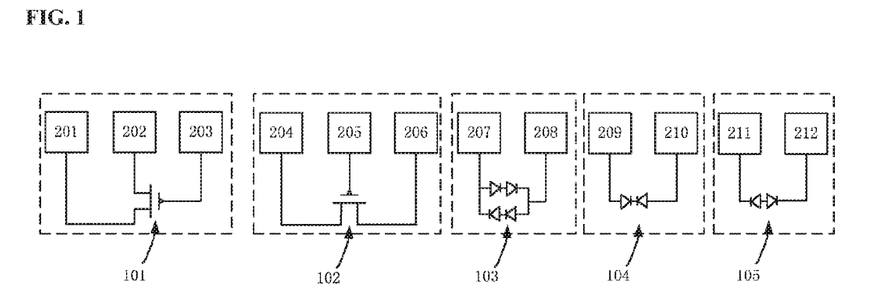
FIG. 1 is a diagram illustrating the structure of a conventional test element group.

FIG. 1 is a diagram illustrating the structure of an array substrate having a conventional test element group. Referring to FIG. 1, the array substrate having the conventional test element group includes a plurality of semiconductor elements to be tested and a plurality of test electrodes for testing electrical characteristics of a plurality of semiconductor elements. The semiconductor elements to be tested include two thin film transistors 101 and 102, and three electrostatic discharge diode circuits 103, 104, and 105. A channel direction of the thin film transistor 101 is substantially perpendicular to that of the thin film transistor 102. The thin film transistor 101 is electrically connected to three different test electrodes 201, 202, and 203. The thin film transistor 102 is electrically connected to three different test electrodes 204, 205, and 206, The electrostatic discharge diode circuit 103 is electrically connected to two different test electrodes 207 and 208, The electrostatic discharge diode circuit 104 is electrically connected to two different test electrodes 209 and 210. The electrostatic discharge diode circuit 105 is electrically connected to two different test electrodes 211 and 212.

In the array substrate having the conventional test element group, each test electrode is electrically connected to only one semiconductor element to be tested, i.e., each semiconductor element to be tested is electrically connected to an independent set of test electrodes. This design results in relatively high manufacturing costs, and requires a bigger panel space to accommodate the test electrodes. Moreover, cumbersome testing procedures must be performed to test electrical properties of multiple semiconductor elements in an array substrate having this design, as it requires the testing device to switch probes among various test electrodes connected to different semiconductor elements.

Accordingly, the present invention provides, inter alia, a test element group, an array substrate and a display panel having the same, a method of testing electrical characteristics of a plurality of semiconductor elements, and a fabricating method thereof that substantially obviate one or more of the problems due to limitations and disadvantages of the related art. In one aspect, the present disclosure provides a test element group for testing electrical characteristics of a plurality of semiconductor elements in a semiconductor device. In some embodiments, the test element group includes a plurality of test electrodes, at least one of which is electrically connected to at least two different semiconductor elements. In the present test element group, each of the plurality of semiconductor elements comprises a plurality of terminals, each of which is electrically connected to a different test electrode.

In another aspect, the present disclosure provides an array substrate having the present test element group. In some embodiments, the present array substrate includes a plurality of semiconductor elements and a plurality of test electrodes. In the present array substrate, each of the plurality of semiconductor elements is electrically connected to at least two of the plurality of test electrode; and at least one of the plurality of test electrodes is electrically connected to at least two of the plurality of semiconductor elements. In some embodiments, each of the plurality of semiconductor elements includes a plurality of terminals, each of which is electrically connected to a different test electrode, and at least one of the plurality of test electrodes is electrically connected to at least two different semiconductor elements. As used herein, the term "terminal" refers to a node, an electrode, or a terminal in a semiconductor element such as a circuit or a semiconductor structure such as a thin film transistor.

By having this design, the number of test electrodes required in the test element group is much less than that in the conventional test element group, and the space needed for accommodating such a test element group can be much reduced. When testing electrical properties of multiple semiconductor elements in the array substrate, some probes of the testing devices may be placed on test electrodes commonly connected to multiple semiconductor elements. Thus, it is not required to switch positions of common probes when testing multiple semiconductor elements. The testing may be performed much more efficiently.

Various appropriate semiconductor elements may be tested using the present test element group. Examples of semiconductor elements to be tested include, but are not limited to, a thin film transistor, an electrostatic discharge diode circuit, a semiconductor photodetector, a pixel compensation circuit, a capacitor, a gate on array circuit, a diode, etc.

In some embodiments, the array substrate having the present test element group includes N semiconductor elements, and (N−1) test electrodes sufficient for testing electrical properties of all of N semiconductor elements. N is a positive integer larger than 1, e.g., 2, 3, 4, 5, or more. Optionally, N is 5. Optionally, the array substrate having the present test element group includes two thin film transistors, three electrostatic discharge diode circuits, and four test electrodes sufficient for testing electrical properties of two thin film transistors and three electrostatic discharge diode circuits.

In some embodiments, the array substrate having the present test element group includes M thin film transistors. M is a positive integer larger than 1, e.g., 2, 3, 4, 5, or more. Optionally, the array substrate having the present test element group includes a first test electrode, a second test electrode, and a third test electrode. All gate electrodes of M thin film transistors are commonly electrically connected to a first test electrode. All source electrodes of M thin film transistors are electrically connected to one of the second test electrode and the third test electrode, but not both. All drain electrodes of M thin film transistors are electrically connected to one of the second test electrode and the third test electrode, but not both.

In some embodiments, the array substrate having the present test element group includes a first thin film transistor, a second thin film transistor, and a first test electrode, a second test electrode, a third test electrode, and a fourth test electrode. The gate electrodes of the first thin film transistor and the second thin film transistor are commonly electrically connected to the first test electrode. One of the source electrode and the drain electrode of the first thin film transistor is electrically connected to the second test electrode; the other one is electrically connected to the third test electrode. One of the source electrode and the drain electrode of the second thin film transistor is electrically connected to the fourth test electrode, and the other one is electrically connected to the third test electrode, Thus, one of the source electrode and the drain electrode of the first thin film transistor and one of the source electrode and the drain electrode of the second thin film transistor are commonly electrically connected to the third test electrode.

In some embodiments, the array substrate having the present test element group includes P electrostatic discharge diode circuits. P is a positive integer larger than 1, e.g., 2, 3, 4, 5, or more. Optionally, the array substrate having the present test element group includes P electrostatic discharge diode circuits and (P+1) test electrodes. The (P+1) test electrodes include two groups of test electrodes, the first of which include (P−1) test electrodes, and the second of which include two remaining test electrodes, Each of the first group of test electrodes is electrically connected to two electrostatic discharge diode circuits, Each of the second group of test electrodes is electrically connected to only one electrostatic discharge diode circuit. Optionally, the test electrodes in the second group are electrically connected to two different electrostatic discharge diode circuits.

In some embodiments, the array substrate having the present test element group includes N semiconductor elements, which include M thin film transistors and P electrostatic discharge diode circuits, N is a positive integer larger than 1, e.g., 2, 3, 4, 5, or more. M is a positive integer larger than 1, e.g., 2, 3, 4, 5, or more. P is a positive integer larger than 1, e.g., 2, 3, 4, 5, or more. Optionally, all gate electrodes of M thin film transistors are commonly electrically connected to a first test electrode. All source electrodes of M thin film transistors are electrically connected to one of the second test electrode and the third test electrode, but not both. All drain electrodes of M thin film transistors are electrically connected to one of the second test electrode and the third test electrode, but not both electrostatic discharge diode circuits are electrically connected to (P+1) test electrodes. The (P+1) test electrodes include two groups of test electrodes, the first of which include (P−1) test electrodes, and the second of which include two remaining test electrodes. Each of the first group of test electrodes is electrically connected to two electrostatic discharge diode circuits. Each of the second group of test electrodes is electrically connected to only one electrostatic discharge diode circuit. Optionally, the test electrodes in the second group are electrically connected to two different electrostatic discharge diode circuits. Optionally, the array substrate having the present test element group includes N semiconductor elements and (N−1) test electrodes sufficient for testing electrical properties of all of N semiconductor elements, wherein the N semiconductor elements include NI thin film transistors and P electrostatic discharge diode circuits.

In some embodiments, the array substrate having the present test element group includes a first electrostatic discharge diode circuit, a second electrostatic discharge diode circuit, a third electrostatic discharge diode circuit, a first test electrode, a second test electrode, a third test electrode, and a fourth test electrode. The first electrostatic discharge diode circuit is electrically connected to the first test electrode and the second test electrode. The second electrostatic discharge diode circuit is electrically connected to the second test electrode and the third test electrode. The third electrostatic discharge diode circuit is electrically connected to the third test electrode and the fourth test electrode.

In some embodiments, the semiconductor elements include a plurality of thin film transistors, Optionally, the plurality of semiconductor elements includes at least a first thin film transistor and a second thin film transistor. The array substrate having the present test element group includes at least a first thin film transistor and a second thin film transistor; and a plurality of test electrodes. Optionally, each of a source electrode, a drain electrode, and a gate electrode of the first thin film transistor is electrically connected to a different test electrode, each of a source electrode, a drain electrode, and a gate electrode of the second thin film transistor is electrically connected to a different test electrode. For example, the source electrode, the drain electrode, and the gate electrode of the first thin film transistor are respectively electrically connected three different test electrodes in a first group of test electrodes; and the source electrode, the drain electrode, and the gate electrode of the first thin film transistor are respectively electrically connected three different test electrodes in a second group of test electrodes. The first group and the second group may have at least one test electrode in common, i.e., the first thin film transistor and the second thin film transistor are commonly electrically connected to at least one test electrode. Optionally, the first group and the second group have at least two test electrodes in common. Optionally, the first group and the second group have all three test electrode in common.

Optionally, a channel region of the first thin film transistor is along a first direction from the source electrode to the drain electrode of the first thin film transistor, and a channel region of the second thin film transistor is along a second direction from the source electrode to the drain electrode of the second thin film transistor. The first direction may be at any angle with the second direction. Optionally, the first direction is substantially parallel to the second direction, Optionally, the first direction is substantially perpendicularly to the second direction.

In some embodiments, the gate electrode of the first thin film transistor and the gate electrode of the second thin film transistor are commonly electrically connected to a first test electrode. Optionally, the gate electrode of the first thin film transistor, the gate electrode of the second thin film transistor, and the first test electrode are in a same layer and are made of a same electrode material. For example, the gate electrode of the first thin film transistor, the gate electrode of the second thin film transistor, and the first test electrode may be formed in a same patterning process using a same electrode material. By having this design, the manufacturing costs can be reduced.

In some embodiments, one of the source electrode and the drain electrode of the first thin film transistor and one of the source electrode and the drain electrode of the second thin film transistor are commonly electrically connected to a second test electrode. Optionally, the source electrode of the first thin film transistor and the source electrode of the second thin film transistor are commonly electrically connected to the second test electrode. Optionally, the source electrode of the first thin film transistor and the drain electrode of the second thin film transistor are commonly electrically connected to the second test electrode. Optionally, the drain electrode of the first thin film transistor and the source electrode of the second thin film transistor are commonly electrically connected to the second test electrode. Optionally, the drain electrode of the first thin film transistor and the drain electrode of the second thin film transistor are commonly electrically connected to the second test electrode.

In some embodiments, the source electrode and the drain electrode of the first thin film transistor, the source electrode and the drain electrode of the second thin film transistor, and the second test electrode are in a same layer and are made of a same electrode material. For example, the source electrode and the drain electrode of the first thin film transistor, the source electrode and the drain electrode of the second thin film transistor, and the second test electrode may be formed in a same patterning process using a same electrode material. By having this design, the manufacturing costs can be reduced.

In some embodiments, the array substrate having the present test element group includes a first thin film transistor and a second first thin film transistor, and a plurality of test electrodes. Optionally, the first thin film transistor and the second first thin film transistor are commonly electrically connected to a test electrode. Optionally, the first thin film transistor and the second first thin film transistor are commonly electrically connected to a first test electrode and a second test electrode.

In some embodiments, the plurality of semiconductor elements include a plurality of electrostatic discharge diode circuits. Optionally, the plurality of electrostatic discharge diode circuits include a first electrostatic discharge diode circuit and a second electrostatic discharge diode circuit. The array substrate having the present test element group includes at least a first electrostatic discharge diode circuit and a second electrostatic discharge diode circuit; and a plurality of test electrodes. Optionally, the first electrostatic discharge diode circuit is electrically connected to two different test electrodes. Optionally, the second electrostatic discharge diode circuit is electrically connected to two different test electrodes. Optionally, the first electrostatic discharge diode circuit and the second electrostatic discharge diode circuit are commonly electrically connected to a third test electrode.

In one example, the array substrate having the present test element group includes a first electrostatic discharge diode circuit, a second electrostatic discharge diode circuit, a first test electrode, a second test electrode, and a third test electrode. The second test electrode is electrically connected to the first electrostatic discharge diode circuit and the second electrostatic discharge diode circuit, the first test electrode is electrically connected to the first electrostatic discharge diode circuit, and the third test electrode is electrically connected to the second electrostatic discharge diode circuit. Optionally, the first test electrode is not electrically connected to the second electrostatic discharge diode circuit. Optionally, the third test electrode is not electrically connected to the first electrostatic discharge diode circuit.

In some embodiments, the plurality of semiconductor elements include at least a first thin film transistor and at least a first electrostatic discharge diode circuit. Optionally, the array substrate having the present test element group includes at least a first thin film transistor, at least a first electrostatic discharge diode circuit, and a plurality of test electrodes. Optionally, each of a source electrode, a drain electrode, and a gate electrode of the first thin film transistor are electrically connected to a different test electrode. Optionally, the first electrostatic discharge diode circuit is electrically connected to two different test electrodes. Optionally, the first thin film transistor and the first electrostatic discharge diode circuit are commonly electrically connected to a fourth test electrode.

Optionally, the source electrode and the drain electrode of the first thin film transistor, and the fourth test electrode are in a same layer and are made of a same electrode material. For example, the source electrode and the drain electrode of the first thin film transistor, and the fourth test electrode may be formed in a same patterning process using a same electrode material. By having this design, the manufacturing costs can be reduced.

In another aspect, the present disclosure provides a method of fabricating an array substrate. In some embodiments, the method includes forming a plurality of semiconductor elements, each of which comprising a plurality of terminals; and forming a plurality of test electrodes. Each of the plurality of semiconductor elements is formed to be electrically connected to at least two of the plurality of test electrode, and at least one of the plurality of test electrodes is formed to be electrically connected to at least two of the plurality of semiconductor elements. In some embodiments, each of the plurality of terminals of each semiconductor element is formed to be electrically connected to a different test electrode, and at least one of the plurality of test electrodes is formed to be electrically connected to at least two of the plurality of semiconductor elements.

In some embodiments, the method includes a pre-cleaning step to remove contaminants from the surface of the base substrate prior to any subsequent step. Various appropriate materials may be used for making the base substrate. Examples of materials suitable for making the base substrate include, but are not limited to, glass, quartz, polyimide, and polyester, etc.

Figure 2:
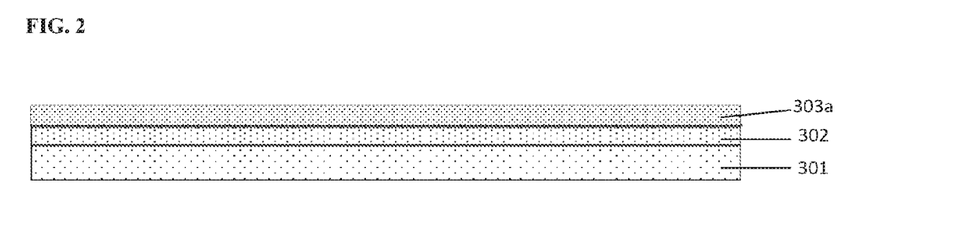
FIGS. 2-14 illustrate a process of fabricating an array substrate in some embodiment according to the present disclosure.

FIGS. 2-14 illustrate a process of fabricating an array substrate in some embodiment according to the present disclosure, Referring to FIG. 2, the method in the embodiment includes forming a buffer layer 302 on a base substrate 301, and forming an amorphous silicon material layer 303a on a side of the buffer layer 302 distal to the base substrate 301.

Various appropriate insulating materials and various appropriate fabricating methods may be used to make the buffer layer 302, For example, an insulating material may be deposited on the substrate by a plasma-enhanced chemical vapor deposition (PECVD) process. Examples of materials suitable for making the buffer layer 302 include, but are not limited to, silicon oxide ($SiO_x$), silicon nitride ($SiN_x$), or a combination thereof. Optionally, the buffer layer 302 may have a single-layer structure or a stacked-layer structure including two or more sub-layers (e.g., a stacked-layer structure including a silicon oxide sublayer and a silicon nitride sublayer). Optionally, the thickness of the buffer layer 302 is in a range of approximately 100 nm to approximately 400 nm. For example, the buffer layer 302 may include a silicon oxide sub-layer having a thickness in a range of approximately 50 nm to approximately 100 nm, and a silicon nitride sub-layer having a thickness in a range of approximately 100 nm to approximately 300 nm.

Various appropriate fabricating methods may be used to make the amorphous silicon material layer. For example, an amorphous silicon material may be deposited on the substrate by a plasma-enhanced chemical vapor deposition process. In some embodiments, the thickness of the amorphous silicon material layer is in a range of approximately 40 nm to approximately 50 nm.

In some embodiments, the method includes dehydrogenating the amorphous silicon material layer 303a (e.g., in a high-temperature oven). Similarly, the purpose of the dehydrogenation process is to reduce or eliminate hydrogen contents in the amorphous silicon material layer, and prevent the occurrence of hydrogen explosion in any subsequent step. Optionally, the hydrogen content of the amorphous silicon material layer 303a is less than 2% by weight after the dehydrogenating step.

Figure 3:
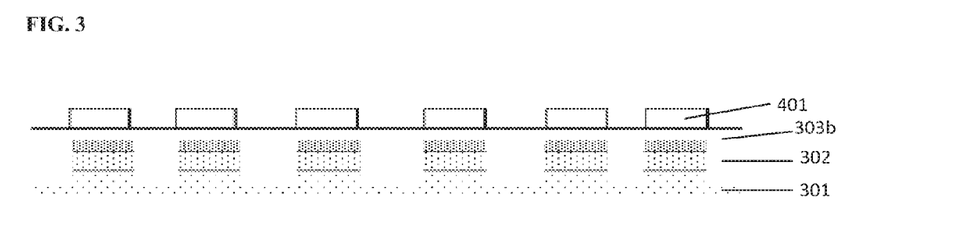

Referring to FIG. 3, the method further includes crystallizing the amorphous silicon material layer 303a to form a polycrystalline silicon layer 303b. The crystallization step may be performed utilizing any appropriate crystallization method. In some embodiments, the crystallization step is performed utilizing a method selected from the group consisting of excimer laser annealing (ELA), solid phase crystallization (SPC), sequential lateral solidification (SLS), metal induced crystallization (MIC), and metal-induced lateral crystallization (MILC). Optionally, the crystallization step is performed using excimer laser annealing.

A photoresist layer is then formed on a side of the polycrystalline silicon layer 303b distal to the buffer layer 302. As shown in FIG. 3, the method further includes exposing the photoresist layer with a mask plate, and developing the exposed photoresist layer to obtain a photoresist pattern 401 corresponding an active layer. The photoresist pattern 401 includes a first section corresponding to the active layer, and a second section outside the first section. The photoresist material is removed in the second section.

Figure 4:
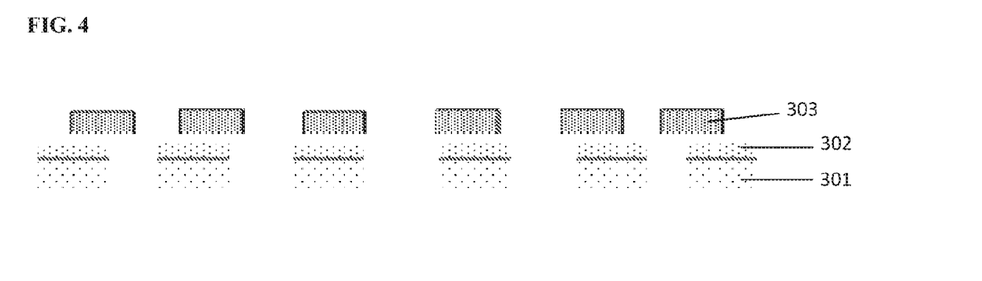

Referring to FIG. 4, the method further includes removing the polycrystalline silicon layer 303b in the second section, e.g., by etching, thereby forming the active layer 303. The remaining photoresist layer 401 in the first section is then removed by, e.g., stripping.

Figure 5:
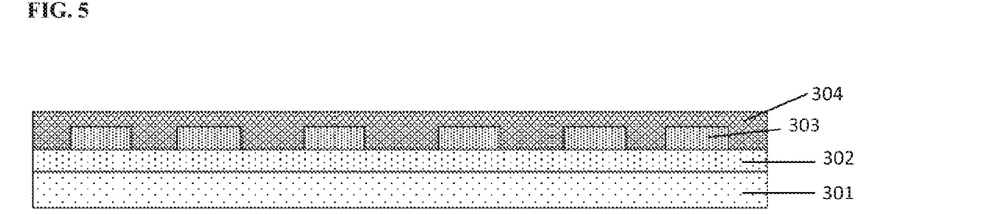

Referring to FIG. 5, the method further includes forming a gate insulating layer 304 on a side of the active layer 303 and the buffer layer 302 distal to the base substrate 301. Various appropriate insulating materials and various appropriate fabricating methods may be used to make the gate insulating layer 304. For example, an insulating material may be deposited on the substrate by a plasma-enhanced chemical vapor deposition process. Examples of materials suitable for making the gate insulating layer 304 include, but are not limited to, silicon oxide ($SiO_y$), silicon nitride ($SiN_y$, e.g., $Si_3N_4$), silicon oxynitride ($SiO_xN_y$). Optionally, the gate insulating layer 304 may have a single-layer structure or a stacked-layer structure including two or more sub-layers (e.g., a stacked-layer structure including a silicon oxide sublayer and a silicon nitride sublayer).

Figure 6:
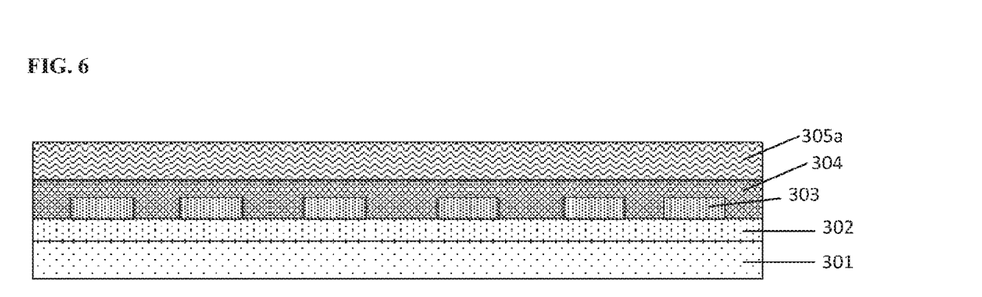

Referring to FIG. 6, the method further includes forming a gate electrode material layer 305a on a side of the gate insulating layer 304 distal to the buffer layer 302. Various appropriate conductive electrode materials and various appropriate fabricating methods may be used to make the gate electrode material layer 305a. For example, a conductive electrode material may be deposited on the substrate by, e.g., sputtering or vapor deposition, and patterned by, e.g., lithography such as a wet etching process to form a gate electrode layer. Examples of appropriate conductive electrode materials include, but are not limited to, aluminum, chromium, tungsten, titanium, tantalum, molybdenum, copper, and alloys or laminates containing the same.

Figure 7:
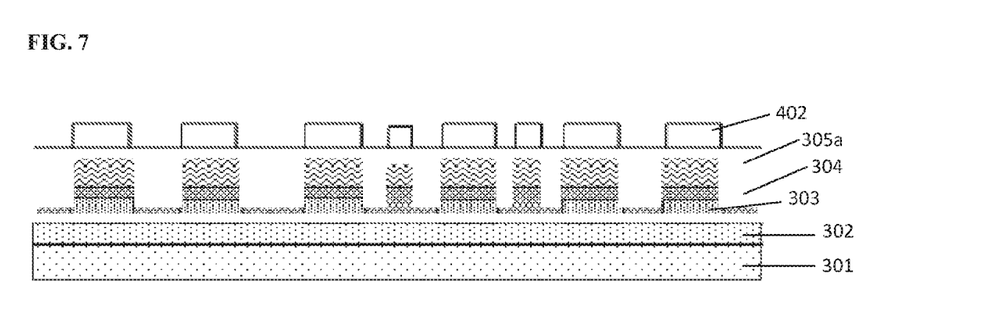

Referring to FIG. 7, the method further includes forming a photoresist layer on a side of the gate electrode material layer 305a distal to the gate insulating layer 304, exposing the photoresist layer with a mask plate, and developing the exposed photoresist layer to obtain a photoresist pattern 402 corresponding a gate electrode layer. The photoresist pattern 402 includes a first section corresponding to the gate electrode layer, and a second section outside the first section. The photoresist material is removed in the second section.

Figure 8:
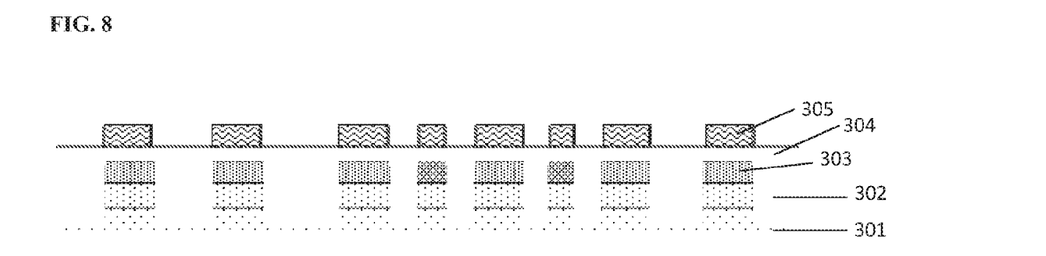

Referring to FIG. 8, the method further includes removing the gate electrode material layer 305a in the second section, e.g., by etching, thereby forming the gate electrode layer 305, The remaining photoresist layer 402 in the first section is then removed by, e.g., stripping.

Figure 9:
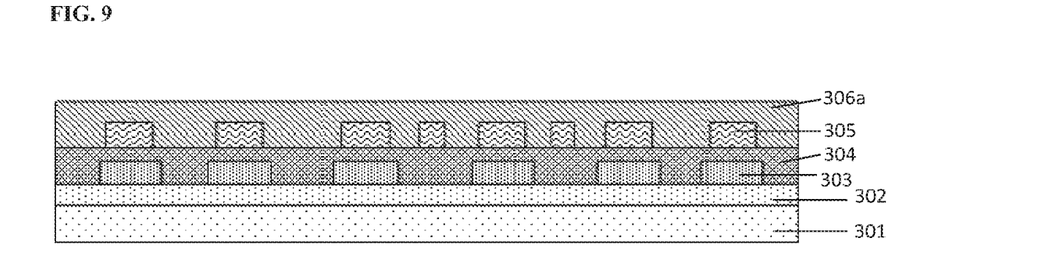

Referring to FIG. 9, the method further includes forming an interlayer dielectric material layer 306a on a side of the gate electrode layer 305 and the gate insulating layer 304 distal to the buffer layer 302, Various appropriate dielectric materials and various appropriate fabricating methods may be used to make the interlayer dielectric layer 306a. For example, a dielectric material may be deposited on the substrate by a plasma-enhanced chemical vapor deposition process, Examples of materials suitable for making the interlayer dielectric material layer 306a include, but are not limited to, silicon oxide ($SiO_y$), silicon nitride ($SiN_y$, e.g., $Si_3N_4$), silicon oxynitride ($SiO_xN_y$). Optionally, the interlayer dielectric material layer 306a may have a single-layer structure or a stacked-layer structure including two or more sub-layers a stacked-layer structure including a silicon oxide sublayer and a silicon nitride sublayer).

Figure 10:
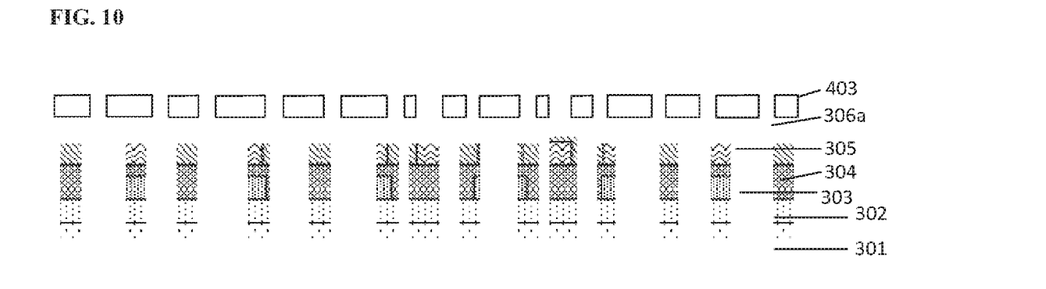

Referring to FIG. 10, the method further includes forming a photoresist layer on a side of the interlayer dielectric material layer 306a distal to the gate insulating layer 304, exposing the photoresist layer with a mask plate, and developing the exposed photoresist layer to obtain a photoresist pattern 403 corresponding an interlayer dielectric layer. The photoresist pattern 403 includes a first section corresponding to the interlayer dielectric layer, and a second section outside the first section. The photoresist material is removed in the second section.

Figure 11:
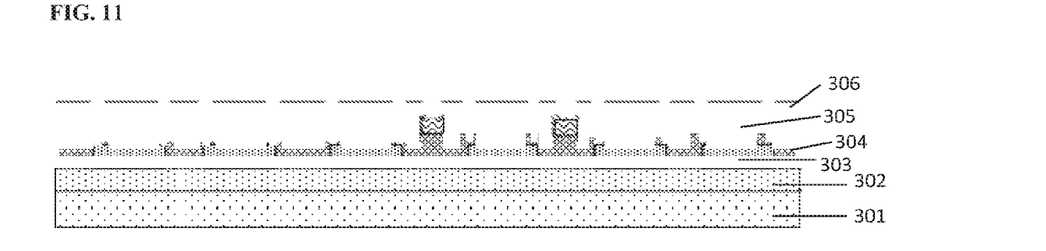

Referring to FIG. 11, the method further includes removing the interlayer dielectric material layer 306a in the second section, e.g., by etching, thereby forming the interlayer dielectric layer 306 and a plurality of vias extending through the interlayer dielectric material layer 306a and the gate insulating layer 304, exposing source electrode contact regions and drain contact region of the active layer 303. The airing photoresist layer 403 in the first section is then removed by, e.g., stripping.

Figure 12:
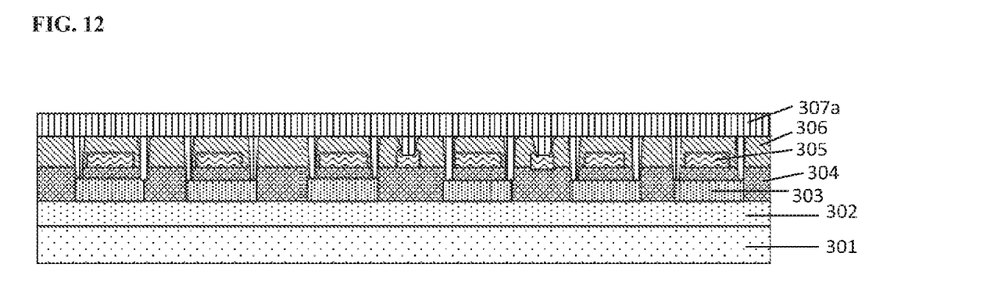

Referring to FIG. 12, the method further includes forming a source and drain electrode material layer 307a on a side of the interlayer dielectric layer 306 distal to the gate insulating layer 304, The source and drain electrode material layer 307a extends through the plurality of vias and is in contact with the active layer 303. Various appropriate conductive electrode materials and various appropriate fabricating methods may be used to make the source and drain electrode material layer 307a. For example, a conductive electrode material may be deposited on the substrate by, e.g., sputtering or vapor deposition, and patterned by, e.g., lithography such as a wet etching process to form a source electrode and a drain electrode, Examples of appropriate conductive electrode materials include, hut are not limited to, aluminum, chromium, tungsten, titanium, tantalum, molybdenum, copper, and alloys or laminates containing the same.

Figure 13:
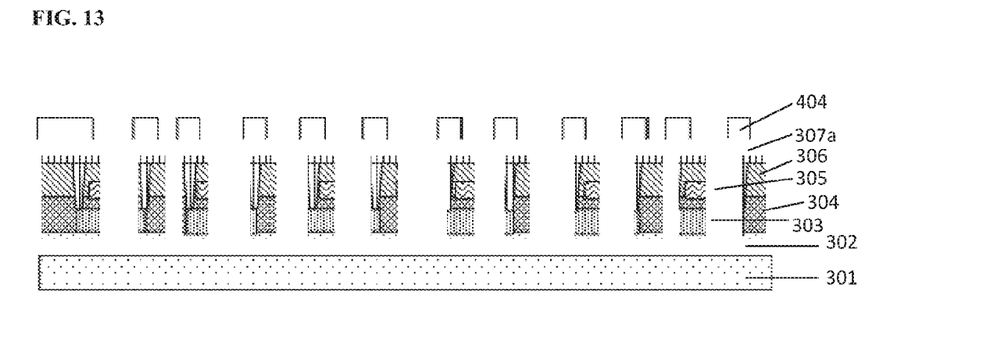

Referring to FIG. 13, the method further includes forming a photoresist layer on a side of the source and drain electrode material layer 307a distal to the interlayer dielectric layer 306, exposing the photoresist layer with a mask plate, and developing the exposed photoresist layer to obtain a photoresist pattern 404 corresponding a source and drain electrode layer. The photoresist pattern 404 includes a first section corresponding to the source and drain electrode layer, and a second section outside the first section. The photoresist material is removed in the second section.

Figure 14:
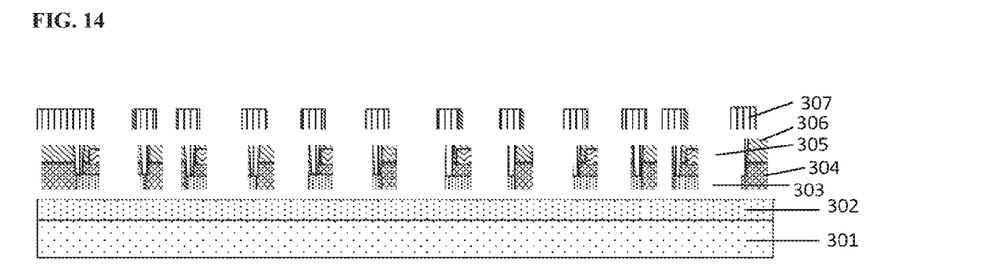

Referring to FIG. 14, the method further includes removing the source and drain electrode material layer 307a in the second section, e.g., by etching, thereby forming the source and drain electrode layer 307. The remaining photoresist layer 404 in the first section is then removed by, e.g., stripping.

Figure 15:
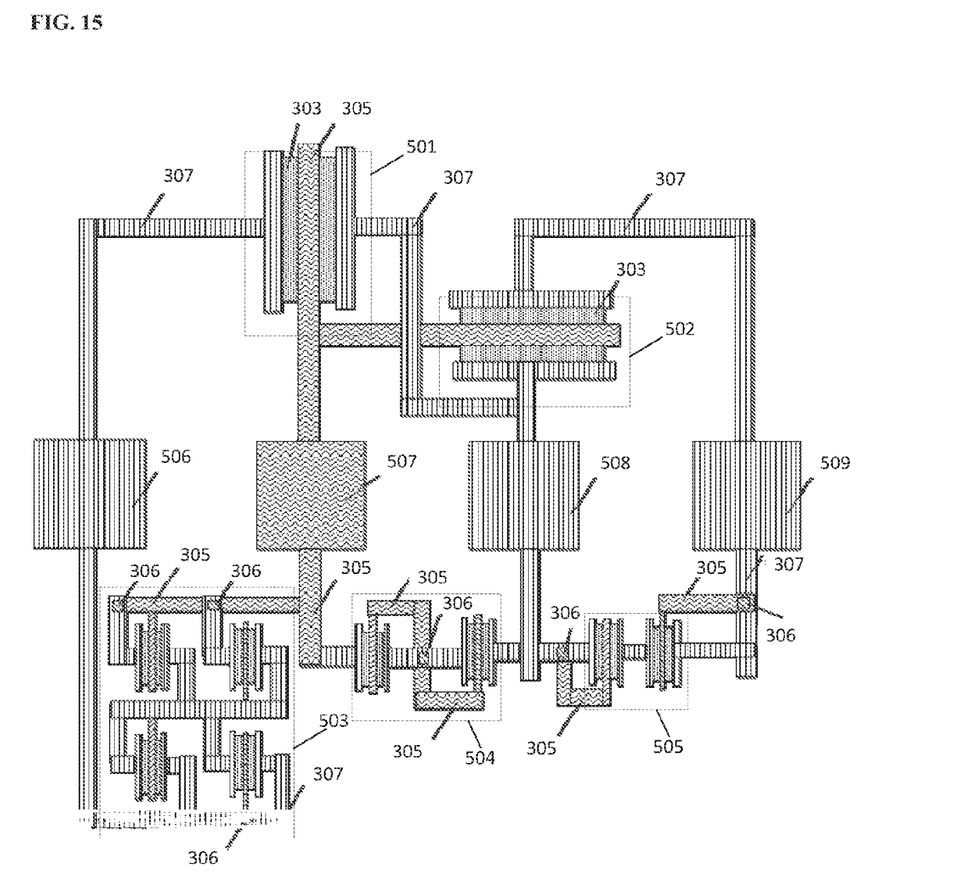
FIG. 15 is a diagram illustrating the structure of an array substrate in some embodiment according to the present disclosure.

FIG. 15 is a diagram illustrating the structure of an array substrate in some embodiment according to the present disclosure. Referring to FIG. 15, the array substrate in the embodiment includes a first thin film transistor 501, a second thin film transistor 502, a first electrostatic discharge diode circuit 503, a second electrostatic discharge diode circuit 504, and a third electrostatic discharge diode circuit 505.

Referring to FIG. 15, the first thin film transistor 501 is electrically connected to three test electrodes 506, 507, and 508. Each of a source electrode, a drain electrode, and a gate electrode of the first thin film transistor 501 is electrically connected to a different test electrode, and each of a source electrode, a drain electrode, and a gate electrode of the first thin film transistor 502 is electrically connected to a different test electrode, Specifically, the source electrode and the drain electrode of the first thin film transistor 501 are electrically connected to the test electrodes 506 and 508. The gate electrode of the first thin film transistor 501 is electrically connected to the test electrode 507. The source electrode and the drain electrode of the second thin film transistor 502 are electrically connected to the test electrodes 508 and 509. The gate electrode of the second thin film transistor 502 is electrically connected to the test electrode 507, Thus, the first thin film transistor 501 and the second thin film transistor 502 are commonly electrically connected to the test electrodes 507 and 508.

A channel region of the first thin film transistor 501 is along a first direction from the source electrode to the drain electrode of the first thin film transistor; a channel region of the second thin film transistor 502 is along a second direction from the source electrode to the drain electrode of the second thin film transistor. As shown in FIG. 15, the first direction is substantially perpendicular to the second direction. Further, the gate electrode of the first thin film transistor 501 and the gate electrode of the second thin film transistor 502 are commonly electrically connected to the test electrode 507, Moreover, one of the source electrode and the drain electrode of the first thin film transistor 501 and one of the source electrode and the drain electrode of the second thin film transistor 502 are commonly electrically connected to the test electrode 508.

The first electrostatic discharge diode circuit 503 is electrically connected to the test electrodes 506 and 507, Each of two electrodes of the first electrostatic discharge diode circuit 503 is electrically connected to a different test electrode, one is electrically connected to the test electrode 506, and the other is electrically connected to the test electrode 507, The second electrostatic discharge diode circuit 504 is electrically connected to the test electrodes 507 and 508.

Each of two electrodes of the second electrostatic discharge diode circuit 504 is electrically connected to a different test electrode, i.e., one is electrically connected to the test electrode 507, and the other is electrically connected to the test electrode 508. The third electrostatic discharge diode circuit 505 is electrically connected to the test electrodes 508 and 509, Each of two electrodes of the third electrostatic discharge diode circuit 505 is electrically connected to a different test electrode, one is electrically connected to the test electrode 508, and the other is electrically connected to the test electrode 509.

As shown in FIG. 15, the first electrostatic discharge diode circuit 503 and the first thin film transistor 501 are commonly electrically connected to the test electrode 506; the first electrostatic discharge diode circuit 503 and the first thin film transistor 501 are commonly electrically connected to the test electrode 507; and the first electrostatic discharge diode circuit 503 and the second electrostatic discharge diode circuit 504 are commonly electrically connected to the test electrode 507.

The second electrostatic discharge diode circuit 504 and the first thin film transistor 501 are commonly electrically connected to the test electrode 507; the second electrostatic discharge diode circuit 504 and the first electrostatic discharge diode circuit 503 are commonly electrically connected to the test electrode 507; the second electrostatic discharge diode circuit 504 and the second thin film transistor 502 are commonly electrically connected to the test electrode 508; and the second electrostatic discharge diode circuit 504 and the third electrostatic discharge diode circuit 505 are commonly electrically connected to the test electrode 508.

The third electrostatic discharge diode circuit 505 and the second thin film transistor 502 are commonly electrically connected to the test electrode 508; the third electrostatic discharge diode circuit 505 and the second thin film transistor 502 are commonly electrically connected to the test electrode 509; and the third electrostatic discharge diode circuit 505 and the second electrostatic discharge diode circuit 504 are commonly electrically connected to the test electrode 508.

In some embodiments, the test electrodes 506, 508, and 509, the source electrode and the drain electrode of the first thin film transistor 501, and the source electrode and the drain electrode of the second thin film transistor 502, are in a same layer (e.g., the source and drain electrode layer 307). Optionally, they are made of a same electrode material in a same patterning process. The test electrode 507, the gate electrode of the first thin film transistor 501, and the gate electrode of the second thin film transistor 502, are in a same layer the gate electrode layer 305). Optionally, they are made of a same electrode material in a same patterning process. In FIG. 15, the array substrate further includes an active layer 303 and an interlayer dielectric layer 306. The test element group in the embodiment can test electrical properties of a plurality of thin film transistors having channel directions perpendicular to each other. Further, the test element group can test electrical properties of a plurality of electrostatic discharge diode circuits. In the test element group as shown in FIG. 15, each test electrode is electrically connected to at least two of the plurality of semiconductor elements. By having this design, the number of test electrodes required in the test element group is much less than that in the conventional test element group, and the space needed for accommodating such a test element group can be much reduced.

In one example, the electrical properties of the semiconductor elements in the array substrate of FIG. 15 may be efficiently tested using a testing device having a plurality of probes. For example, when testing the electrical properties of the first thin film transistor 501, three probes are placed on the test electrodes 506, 507, and 508. A voltage is applied to the test electrodes 506 and 507, respectively. The electrical properties of the first thin film transistor 501 is tested by a signal received at the probe placed on the test electrode 508. Alternatively, a voltage may be applied to the test electrode 508, and the electrical properties of the first thin film transistor 501 is tested by a signal received at the probe placed on the test electrode 506.

In another example, when the test on the first thin film transistor 501 is complete, the electrical properties of the second thin film transistor 502 may be conveniently performed by simply moving the probe on the test electrode 506 to the test electrode 509. The positions of the probes on the test electrodes 507 and 508 may remain unchanged, Subsequently, a voltage signal is applied to the test electrode 509 and 507, the electrical properties of the second thin film transistor 502 is tested by a signal received at the probe placed on the test electrode 508. Alternatively, a voltage may be applied to the test electrode 508, and the electrical properties of the first thin film transistor 501 is tested by a signal received at the probe placed on the test electrode 509.

Thus, for testing two thin film transistors 501 and 502 sequentially, it requires moving only one probe of the testing device, the other two probes need not be moved. The testing of multiple thin film transistors may be efficiently performed.

In another example, when the test on the second thin film transistor 502 is complete, the electrical properties of the third electrostatic discharge diode circuit 505 may be conveniently performed without moving any probe of the testing device, i.e., the probes remain on the test electrodes 507, 508, and 509. A voltage signal is applied to one of the test electrodes 508 and 509, the electrical properties of the third electrostatic discharge diode circuit 505 is tested by a signal received at the probe placed on the other one of the test electrodes 508 and 509. The probe placed on the test electrode 507 stays idle in this process, i.e., no voltage signal is applied to the probe placed on the test electrode 507.

In another example, when the test on the third electrostatic discharge diode circuit 505 is complete, the electrical properties of the second electrostatic discharge diode circuit 504 may be conveniently performed without moving any probe of the testing device, i.e., the probes remain on the test electrodes 507, 508, and 509. A voltage signal is applied to one of the test electrodes 507 and 508, the electrical properties of the second electrostatic discharge diode circuit 504 is tested by a signal received at the probe placed on the other one of the test electrodes 507 and 508. The probe placed on the test electrode 509 stays idle in this process, i.e., no voltage signal is applied to the probe placed on the test electrode 509.

In another example, when the test on the second electrostatic discharge diode circuit 504 is complete, the electrical properties of the first electrostatic discharge diode circuit 503 may be conveniently performed by simply moving one or both of the probes on the test electrodes 508 and 509 to the test electrode 506. The position of the probes on the test electrode 507 may remain unchanged. Subsequently, a voltage signal is applied to one of the test electrodes 506 and 507, the electrical properties of the first electrostatic discharge diode circuit 503 is tested by a signal received at the probe placed on the other one of the test electrodes 506 and 507.

Using the present test element group (e.g., the test element group illustrated in FIG. 15), a plurality of semiconductor elements may be tested efficiently as the testing process minimizes the number of times the positions of the probes are switched. For example, when testing two semiconductor elements sequentially, the probes placed on the test electrodes commonly electrically connected to the two semiconductor elements need not be moved. This design greatly reduces the total time for testing a plurality of semiconductor elements, resulting in an enhanced efficiency, Defects in the array substrate having the present test element group may be detected early on in the manufacturing process, thus the manufacturing costs may be reduced by repairing the defects in the early process. Moreover, the present test element group may be used as a quality control measurement for monitoring the process stability and various process parameters, thus significantly improving the manufacturing productivity.

In another aspect, the present disclosure provides an array substrate having a test element group described herein or fabricated by a method described herein. The array substrate includes a display area and a peripheral area. Optionally, the test element group (e.g., a plurality of test electrodes of the test element group) is disposed in the peripheral area of the array substrate. Optionally, the array substrate is an array substrate in an active matrix liquid crystal display panel. Optionally, the array substrate is an array substrate in an active matrix organic light emitting display panel.

As used herein, the term "display area" refers to an area of the display substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels. As used herein the term "peripheral area" refers to an area where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas.

In another aspect, the present disclosure provides a display panel having an array substrate described herein.

In another aspect, the present disclosure provides a display apparatus having a display panel described herein. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated, it is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
   a plurality of semiconductor elements; and
   a plurality of test electrodes;
   wherein each of the plurality of semiconductor elements comprises a plurality of terminals, each of which is electrically connected to a different test electrode;
   at least one of the plurality of test electrodes is electrically connected to at least two different semiconductor elements;
   the plurality of semiconductor elements comprise at least a first electrostatic discharge diode circuit and a second electrostatic discharge diode circuit;
   the first electrostatic discharge diode circuit is electrically connected to two different test electrodes;
   the second electrostatic discharge diode circuit is electrically connected to two different test electrodes;
   the first electrostatic discharge diode circuit is electrically connected to a third test electrode; and
   the second electrostatic discharge diode circuit is electrically connected to the third test electrode.

2. The array substrate of claim 1, comprising M thin film transistors; a first test electrode, a second test electrode, and a third test electrode; M is a positive integer larger than 1;
   wherein all gate electrodes of M thin film transistors are commonly electrically connected to a first test electrode;
   all source electrodes of M thin film transistors are electrically connected to one of the second test electrode and the third test electrode, but not both; and
   all drain electrodes of M thin film transistors are electrically connected to one of the second test electrode and the third test electrode, but not both.

3. The array substrate of claim 1, comprising P electrostatic discharge diode circuits; and (P+1) test electrodes comprising a first group of test electrodes and a second group of test electrodes; P is a positive integer larger than 1;

wherein the first group of test electrodes comprises (P−1) test electrodes, and the second group of test electrode comprises two test electrodes;

each of the first group of test electrodes is electrically connected to two electrostatic discharge diode circuits;

each of the second group of test electrodes is electrically connected to only one electrostatic discharge diode circuit; and the two test electrodes in the second group are electrically connected to two different electrostatic discharge diode circuits.

4. The array substrate of claim 3, further comprising M thin film transistors; M is a positive integer larger than 1;

wherein the (P+1) test electrodes comprises a first test electrode, a second test electrode, and a third test electrode;

all gate electrodes of M thin film transistors are commonly electrically connected to a first test electrode;

all source electrodes of M thin film transistors are electrically connected to one of the second test electrode and the third test electrode, but not both; and all drain electrodes of M thin film transistors are electrically connected to one of the second test electrode and the third test electrode, but not both.

5. The array substrate of claim 4, wherein M is 2, and P is 3.

6. The array substrate of claim 1, comprising N semiconductor elements, and (N−1) test electrodes sufficient for testing electrical properties of all of N semiconductor elements; N is a positive integer larger than 1.

7. The array substrate of claim 1, having a display area and a peripheral area, wherein the plurality of test electrodes are in the peripheral area.

8. A display panel, comprising an array substrate of claim 1.

9. A display apparatus, comprising a display panel of claim 8.

10. An array substrate, comprising:
a plurality of semiconductor elements; and
a plurality of test electrodes;
wherein each of the plurality of semiconductor elements comprises a plurality of terminals, each of which is electrically connected to a different test electrode;
at least one of the plurality of test electrodes is electrically connected to at least two different semiconductor elements;
the plurality of semiconductor elements comprise at least a first thin film transistor and at least a first electrostatic discharge diode circuit;
each of a source electrode, a drain electrode, and a gate electrode of the first thin film transistor are electrically connected to a different test electrode;
the first electrostatic discharge diode circuit is electrically connected to two different test electrodes; and
the first thin film transistor and the first electrostatic discharge diode circuit are commonly electrically connected to a fourth test electrode.

11. The array substrate of claim 10, wherein the source electrode and the drain electrode of the first thin film transistor, and the fourth test electrode are in a same layer and are made of a same electrode material.

12. The array substrate of claim 10, comprising M thin film transistors; a first test electrode, a second test electrode, and a third test electrode; M is a positive integer larger than 1;

wherein all gate electrodes of M thin film transistors are commonly electrically connected to a first test electrode;

all source electrodes of M thin film transistors are electrically connected to one of the second test electrode and the third test electrode, but not both; and all drain electrodes of M thin film transistors are electrically connected to one of the second test electrode and the third test electrode, but not both.

13. The array substrate of claim 10, comprising P electrostatic discharge diode circuits; and (P+1) test electrodes comprising a first group of test electrodes and a second group of test electrodes; P is a positive integer larger than 1;

wherein the first group of test electrodes comprises (P−1) test electrodes, and the second group of test electrode comprises two test electrodes;

each of the first group of test electrodes is electrically connected to two electrostatic discharge diode circuits;

each of the second group of test electrodes is electrically connected to only one electrostatic discharge diode circuit; and the two test electrodes in the second group are electrically connected to two different electrostatic discharge diode circuits.

14. The array substrate of claim 13, further comprising M thin film transistors; M is a positive integer larger than 1;

wherein the (P+1) test electrodes comprises a first test electrode, a second test electrode, and a third test electrode;

all gate electrodes of M thin film transistors are commonly electrically connected to a first test electrode;

all source electrodes of M thin film transistors are electrically connected to one of the second test electrode and the third test electrode, but not both; and all drain electrodes of M thin film transistors are electrically connected to one of the second test electrode and the third test electrode, but not both.

15. The array substrate of claim 14, wherein M is 2, and P is 3.

16. The array substrate of claim 10, comprising N semiconductor elements, and (N−1) test electrodes sufficient for testing electrical properties of all of N semiconductor elements; N is a positive integer larger than 1.

17. The array substrate of claim 10, having a display area and a peripheral area, wherein the plurality of test electrodes are in the peripheral area.

18. A display panel, comprising an array substrate of claim 10.

19. A display apparatus, comprising a display panel of claim 18.

20. A method of testing electrical properties of a plurality of semiconductor elements in a semiconductor device having a plurality of test electrodes; the plurality of semiconductor elements comprise at least a first semiconductor element and a second semiconductor element, the first semiconductor element and the second semiconductor element are commonly electrically connected to at least one of the plurality of test electrode;

the method comprising sequentially testing electrical properties of the first semiconductor element and the second semiconductor element using a testing apparatus having a plurality probes;

wherein the step of testing electrical properties of the first semiconductor element comprises placing two or more probes on two or more test electrodes electrically connected to the first semiconductor element; and applying a voltage signal to one of the two or more test electrodes electrically connected to the first semiconductor element, the two or more test electrodes electrically connected to the first semiconductor element comprises a first test electrode;

the step of testing electrical properties of the second semiconductor element comprises placing two or more probes on two or more test electrodes electrically connected to the second semiconductor element; and applying a voltage signal to one of the two or more test electrodes electrically connected to the second semiconductor element, the two or more test electrodes electrically connected to the second semiconductor element comprises a second test electrode, the second test electrode being different from the first test electrode;

the step of testing electrical properties of the second semiconductor element is performed subsequent to the step of testing electrical properties of the first semiconductor element; and prior to the step of testing electrical properties of the second semiconductor element; a probe placed on the at least one of the plurality of test electrode electrically connected to both the first semiconductor element and the second semiconductor element remains on the at least one of the plurality of test electrode, and a probe placed on the first test electrode is moved to be placed on the second test electrode.

* * * * *